United States Patent [19]

Fukushima et al.

[11] 4,322,640
[45] Mar. 30, 1982

[54] THREE-STATE OUTPUT CIRCUIT

[75] Inventors: Toshitaka Fukushima; Kouji Ueno, both of Yokohama, Japan

[73] Assignee: Fujitsu Limited, Kawasaki, Japan

[21] Appl. No.: 95,073

[22] Filed: Nov. 16, 1979

[30] Foreign Application Priority Data

Nov. 25, 1978 [JP] Japan .............................. 53-145831

[51] Int. Cl.³ .............................................. H03K 19/20
[52] U.S. Cl. ..................................... 307/473; 307/456
[58] Field of Search ............................... 307/209, 214

[56] References Cited

U.S. PATENT DOCUMENTS 3,515,899 6/1970 May ................................ 307/214 X
3,980,898 9/1976 Priel .................................... 307/209
4,081,695 3/1978 Allen et al. ......................... 307/209

Primary Examiner—James B. Mullins
Attorney, Agent, or Firm—Staas & Halsey

[57] ABSTRACT

A three-state output circuit is disclosed. The three-state output circuit is comprised of a phase-splitter transistor, a pull-up transistor and a pull-down transistor and further comprised of a control circuit which operates to make the transistors active or non-active. At least one of said transistors is connected to the control circuit via a newly employed PNP transistor through its emitter and base. The collector thereof is connected to a ground point of the three-state output circuit.

8 Claims, 7 Drawing Figures

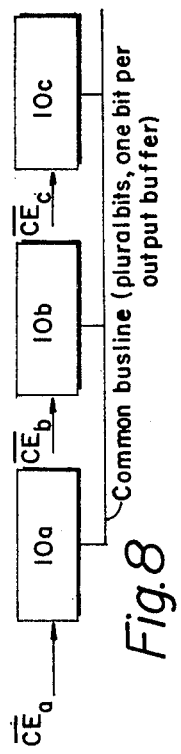
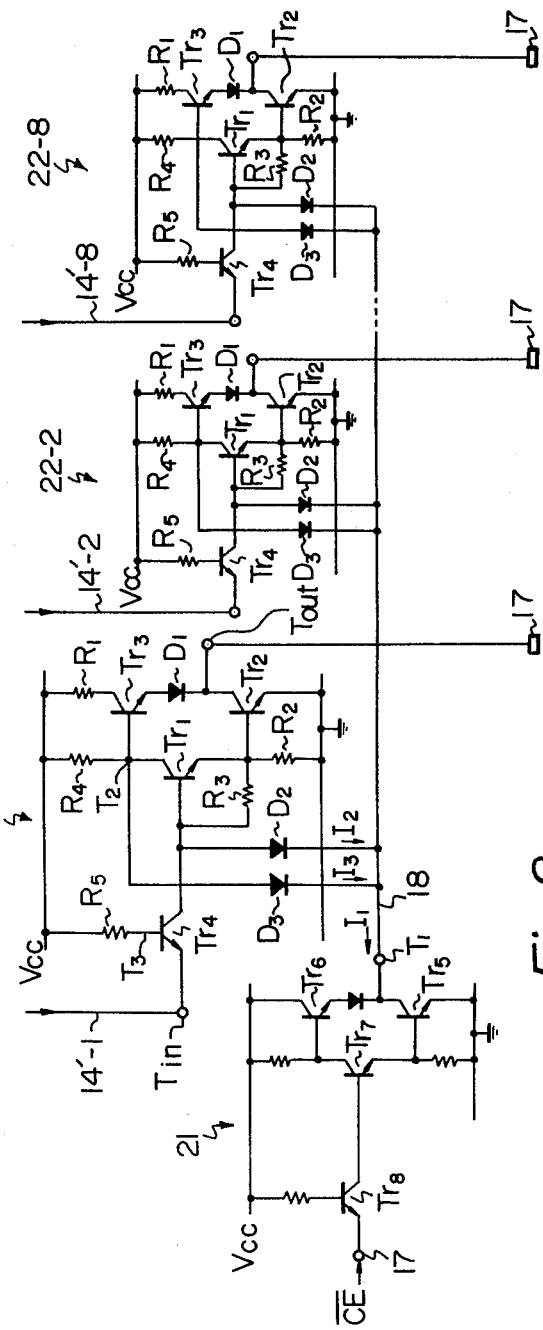
Fig.8
Fig.2

THREE-STATE OUTPUT CIRCUIT

BACKGROUND OF THE INVENTION

The present invention relates to a three-state output circuit.

The three-state output circuit is very useful for fabricating memory circuits or logic circuits, for the purpose of simplifying the circuit constructions thereof. The wording "three-state" represents, firstly a normal "H" (high) level state of the output signal, secondly a normal "L" (low) level state of the output signal and thirdly a high-impedance state "Z" of the output stage. Thus, when the three-state output circuit is caused to be active, this circuit produces, from its output stage, an "H" level output signal or an "L" level output signal in accordance with the logic of an input signal applied thereto. Contrary to this, when the three-state output circuit is caused to be non-active, the output stage thereof becomes the high-impedance state. In other words, the output impedance of the three-state circuit becomes high. This high-impedance state allows, in a memory circuit system, time-sharing of a common bus line. This high-impedance state also allows, in the logic circuit system, construction of a simple wired-OR logic circuit.

The three-state output circuit is divided, as a whole, into a first stage, a second stage and a third stage. The first stage functions as an input circuit which receives an input logic signal having a logic "1" or "0". The third stage corresponds to the aforesaid output stage of the three-state output circuit. The second stage functions as a control circuit which causes the third stage, that is the output stage, to be the high-impedance state "Z" or the normal state, in which normal state the output stage produces an "H" or an "L" level output signal in accordance with the logic of said input logic signal applied to the first stage, that is the input circuit.

As will be explained hereinafter, when the three-state output circuit is caused to be active, the control circuit operates to absorb a current from a power supply line via the output stage and also via the input circuit. The current to be absorbed from the power line to the control circuit is considerably large, in the case where the control circuit is employed as a chip enable circuit in the memory device. This is because the chip enable circuit is common to all the four or eight output stages, when the memory device is constructed as a 4-bit output memory device or an 8-bit output memory device, respectively. In this case, said current to be adsorbed from the power supply line and fed to the control circuit, that is the chip enable circuit, is called a chip enable current. Since the chip enable circuit is common to all the said output stages, the level of the magnitude of the chip enable current becomes four times as high as the level of the magnitude of the current to be absorbed through each said input circuit and output stage, when operating as the 4-bit output memory device, or eight times as high as the level of the magnitude of the current to be absorbed through each said input circuit and output stage, when operating as the 8-bit output memory device.

Consequently, the chip enable circuit, that is the control circuit, must be comprised of high power transistors and thereby the circuit pattern thereof becomes very large in size. Therefore, the amount of the parasistic capacitance is caused to be very large due to the creation of said large size circuit pattern. Further, since the chip enable current is very large, a chip enable line must be fabricated so as to be very wide in width thereof. Furthermore, since the chip enable current is common to all pairs of said input circuits and output stages and all these pairs are arranged side by side with a predetermined space between each two pairs, the length of the chip enable line becomes very long. Therefore, the amount of the stray capacitance is caused to be very large due to the existence of the very long and wide chip enable line. The above mentioned large amounts of both the parasistic capacitance and the stray capacitance apparently result in the fact that the operating speed of the three-state output circuit is reduced and, as a result, the operating speed of the memory device is reduced.

SUMMARY OF THE INVENTION

Therefore, it is an object of the present invention to provide a three-state output circuit including a control circuit which can be comprised of a low power transistors, and accordingly, the amount of said parasistic capacitance and also the amount of said stray capacitance can be considerably reduced, which fact results in an increase in the operating speed of the circuit.

BRIEF DESCRIPTION OF THE DRAWINGS

The present invention will be more apparent from the ensuing description with reference to the accompanying drawings wherein:

FIG. 2 illustrates a circuit diagram of a typical three-state output circuit;

FIG. 8 shows a memory system comprising a plurality of memory devices with the outputs connected in parallel to a common bus line and means for enabling the outputs of a selected memory device.

DETAILED DESCRIPTION OF THE PREFERRED EMBODIMENTS

Figure 1:
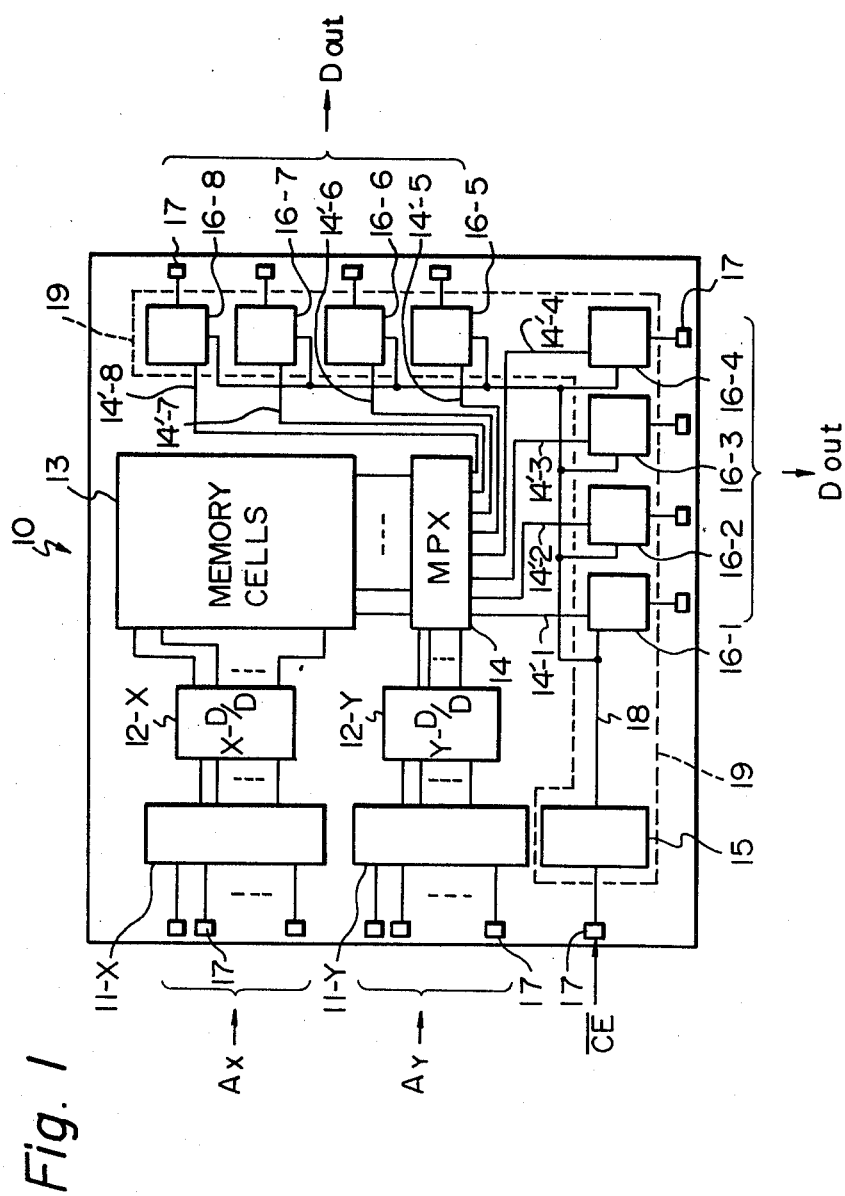
FIG. 1 schematically illustrates a plan view of a typical IC (Integrated Circuit) memory device in which a three-state output circuit of the present invention may preferably be employed therein.

In FIG. 1, which schematically illustrates a plan view of a typical IC (Integrated Circuit) memory device in which a three-state output circuit of the present invention may preferably be employed therein, the reference numeral 10 represents a memory device. The memory device 10 may be an ROM (Read Only Memory), an RAM (Random Access Memory) or a PROM (Programmable ROM). However, in FIG. 1, a PROM type memory circuit is illustrated. The memory device 10 is comprised of an X-address buffer (X-ADDRESS) 11-X, an X-decoder driver (X-D/D) 12-X, memory cells (MEMORY CELLS) 13, a Y-address buffer (Y-ADDRESS) 11-Y, a Y-decoder driver (Y-D/D) 12-Y, a multiplexer (MPX) 14, a chip enable circuit 15 and output buffers 16-1 through 16-8. Since the 8-bit output memory device 10 is illustrated, as an example, there are eight numbers of the output buffers 16-1 through 16-8. The functions of the recited members are well known by persons skilled in the art, however, these functions are, in brief, as follows. The X-address buffer 11-X receives, via respective terminal pads 17, an X-address input signal $A_X$ and specifies one of the word lines of the memory cells 13 via the X-decoder driver 12-X. The stored data of all the memory cells connected to the specified word line are simultaneously transferred to and latched in the multiplexer 14. On the other hand, the Y-address buffer 11-Y receives, via respective terminal pads 17, a Y-address input signal $A_Y$ and specifies one of the bit lines of the memory cells 13 via the Y-decoder driver 12-Y and the multiplexer 14. Thus, the data corresponding to the specified bit line is selected from the data which have been latched in the multiplexer 14. The specified data, that is the data to be read from the memory cells 13, is an 8-bit output data and is applied to the respective output buffers 16-1 through 16-8 from the multiplexer 14 via the respective lines 14'-1 through 14'-8. If the memory device 10 is caused to be active by means of the chip enable circuit 15, then the specified data is produced from the output buffers 16-1 through 16-8, via the respective terminal pads 17, as an output data $D_{out}$. The data $D_{out}$ is transferred to the common bus line (not shown). If the memory device 10 is caused to be non-active by means of the chip enable circuit 15, then no data is produced from the output buffers. Whether the memory device 10 is to be active or non-active is instructed by the chip enable input signal $\overline{CE}$ to be applied to the chip enable circuit 15, and the chip enable circuit 15 controls the output buffers 16-1 through 16-8, as one body, via a chip enable line 18 so that the output buffers 16-1 through 16-8 are caused to be active or non-active, in accordance with the logic of the chip enable input signal $\overline{CE}$. Usually, since the memory device 10 is controlled under a negative logic, the chip enable signal is represented by an inverted enable input signal CE, that is a signal $\overline{CE}$.

In FIG. 1 the present invention is specifically related to the chip enable circuit 15 and the output buffers 16-1 through 16-8, which are enclosed by a dotted line 19. In a memory system having a plurality of memory devices 10a, 10b, 10c (FIG. 8) each of which is similar to the memory device 10 and a common bus line which connects all the memory devices in parallel, it is desirable to construct the circuit enclosed by the dotted line 19 of the memory device 10 and also the corresponding circuits of the remaining memory devices, as the three-state output circuits. This is because, the high-impedance states "Z" of the three-state circuits, which are caused to be non-active by the signals $\overline{CEa}$, $\overline{CBb}$, $\overline{CEc}$, are, as previously mentioned, available to time-share the aforesaid common bus line. That is, the output data from the three-state output circuit, which is now caused to be active, cannot be damaged, because of the presence of the high-impedance state "Z" of the remaining three-state output circuits.

The three-state output circuit has already been known, for example in "The TTL Data Book for Design Engineers" Second Edition, pages 6-36 through 6-38, issued, 1976 by the engineering staff of *TEXAS INSTRUMENTS INCORPORATED* (printed in U.S.A.).

FIG. 2 illustrates a circuit diagram of a typical three-state output circuit. In FIG. 2, the three-state output circuit 20 corresponds to the circuit enclosed by the dotted line 19 in FIG. 1. However, the three-state output circuit 20 is basically comprised of a control circuit 21 (corresponding to the chip enable circuit 15 shown in FIG. 1) and at least one of the circuits 22-1 through 22-8 which respectively correspond to the output buffers 16-1 through 16-8 shown in FIG. 1. Accordingly, the three-state output circuit is comprised of the control circuit 21 and one of the circuits 22-1 through 22-8, for example, the circuit 22-1. Each of the remaining circuits 22-2 through 22-8 has identical circuit construction to that of the circuit 22-1.

In operation, if the control signal, that is the chip enable signal $\overline{CE}$, is applied to the terminal pad 17, the circuit 22-1 (and also the circuits 22-2 through 22-8) is caused to be active. Accordingly, the circuit 22-1, that is the output buffer 16-1, produces a first bit of the output data $D_{out}$ from an output terminal $T_{out}$, in accordance with the logic of a first bit of the data, supplied from the multiplexer 14 (see FIG. 1) via the line 14'-1 and applied to an input terminal $T_{in}$. The terminal $T_{in}$ is connected to an NPN input transistor $T_{r4}$ at the emitter thereof. The transistor $T_{r4}$ is connected, at its collector, to an NPN phase-splitter transistor $T_{r1}$, at its base. These transistors $T_{r4}$ and $T_{r1}$ constitute a major part of the aforesaid input circuit of the three-state output circuit. The transistor $T_{r1}$ is connected, at its collector, to an NPN pull-up transistor $T_{r3}$, at its base. The transistor $T_{r1}$ is also connected, at its emitter, to an NPN pull-down transistor $T_{r2}$, at its base. A level shifting diode $D_1$ is connected between the emitter of the transistor $T_{r3}$ and the collector of the transistor $T_{r2}$, and the node between the diode $D_1$ and the transistor $T_{r2}$ leads to the terminal $T_{out}$. The transistors $T_{r3}$ and $T_{r2}$ constitute the major part of the aforesaid output stage of the three-state output circuit. Diode $D_2$ is connected between the control circuit 21 and the transistor $T_{r1}$, at its base. Diode $D_3$ is connected between the control circuit 21 and the transistor $T_{r3}$, at its base. These two diodes $D_2$ and $D_3$ operate to create the high-impedance state "Z" of the output stage.

In a case where the control signal, that is the chip enable signal $\overline{CE}$ having low level, is applied to the control circuit 21, that is the chip enable circuit, a transistor $T_{r5}$ of the circuit 21 is caused to be non-conductive and a transistor $T_{r6}$ of the circuit 21 is caused to be conductive. Therefore, a high level "H" signal appears at a terminal $T_1$. In such a case, when the logic "1" or "0" is applied to the terminal $T_{in}$, the transistor $T_{r4}$ is caused to be non-conductive or conductive, respectively, and accordingly, the transistor $T_{r1}$ is caused to be conductive or non-conductive, respectively. The transistor $T_{r2}$ is caused to be conductive or non-conductive, when the transistor $T_{r1}$ becomes conductive or non-conductive, respectively. On the contrary, the transistor $T_{r3}$ is caused to be non-conductive or conductive, when the transistor $T_{r1}$ becomes conductive or non-conductive. In short, the transistor $T_{r2}$ is operated in the same mode as that of the transistor $T_{r1}$, while, the transistor $T_{r3}$ is operated in the reversed mode of the transistor $T_{r1}$. Thus, if the logic "1" is applied to the terminal $T_{in}$, the transistor $T_{r3}$ is caused to be non-conductive and the transistor $T_{r2}$ is caused to be conductive, and thereby, an output signal having an "L" level is produced from the terminal $T_{out}$. Contrary to the above, if the logic "0" is applied to the terminal $T_{in}$, the transistor $T_{r3}$ is caused to be conductive and the transistor $T_{r2}$ is caused to be non-conductive, and thereby, an output signal having an "H" level is produced from the terminal $T_{out}$.

Contrary to the above, in a case where the control signal, that is the chip enable signal $\overline{CE}$ having high level, is applied to the control circuit 21, that is the chip enable circuit, the transistor $T_{r5}$ is caused to be conductive and the transistor $T_{r6}$ is caused to be non-conductive. Therefore, a low level "L" signal, for example 0.4 V, appears at the terminal $T_1$. In such a case, the low level "L" signal at the terminal $T_1$ is applied to both the bases of the transistors $T_{r1}$ and $T_{r2}$ via the diode $D_2$, and also, the low level "L" signal at the terminal $T_1$ is applied to the base of the transistor $T_{r3}$. Consequently, the transistors $T_{r2}$ and $T_{r3}$ comprising the output stage of the three-state output circuit, are turned off simultaneously, and thereby, the high-impedance "Z" appears at the terminal $T_{out}$.

The diodes $D_2$ and $D_3$ function, when the circuit 22-1 is caused to be active, to choke a reverse current which would flow from the terminal $T_1$ of the circuit 21 if there were no such diodes. The diodes $D_2$ and $D_3$ also function, as previously explained, to make each of the transistors $T_{r1}$, $T_{r2}$ and $T_{r3}$ non-conductive, so as to create the high-impedance state "Z" at the terminal $T_{out}$, when the circuit 22-1 is caused to be non-active. The circuit 22-1 is caused to be non-active when the control signal, that is the chip enable signal $\overline{CE}$ having high level, is applied to the control circuit 21, and thereby, the transistor $T_{r5}$ is caused to be conductive. Accordingly, when the circuit 22-1 is caused to be non-active, control currents $I_2$ and $I_3$ flow from the circuit 22-1 to the transistor $T_{r5}$ which is now conductive via the diodes $D_2$ and $D_3$, respectively. Each of the magnitudes of the control currents $I_2$ and $I_3$ is calculated by the following procedure. The potential level at a node $T_2$ becomes about 3.8 V which is derived from the equation, that is 3.8 V=5 V−1.2 V. The value 5 V denotes the voltage of a power supply line ($V_{CC}$), and the value 1.2 V is derived from the equation 1.2 V=0.4 V+0.8 V. The value 0.4 V denotes the output signal level, as previously mentioned, at the terminal $T_1$, and the value 0.8 V denotes the forward voltage drop across the diode $D_3$. Then, the magnitude of the control current $I_3$ may be calculated by the equation, that is $$I_3 = \frac{3.8V}{1\,k\Omega} \simeq 4\ mA.$$

The value 3.8 V is, as mentioned above, the potential level at the node $T_2$, the value 1 k$\Omega$ is the resistance value of a resistor $R_4$. Resistance values of resistors $R_1$, $R_2$ and $R_3$ are selected to have the values of 0.1 k$\Omega$, 1.0 k$\Omega$ and 2.5 k$\Omega$, respectively.

The potential level at a point $T_3$ becomes about 3.0 V which is derived from the equation, that is 3.0 V=5 V−2.0 V. The value 5 V denotes the voltage of the power supply line ($V_{CC}$), the value 2.0 V is the sum derived from the equation 2.0 V=0.4 V+0.8 V+0.8 V. The value 0.4 V denotes the output signal level, as previously mentioned, at the terminal $T_1$, the value 0.8 V denotes the forward voltage drop across the diode $D_2$, and the valve 0.8 V denotes the base-collector voltage of the transistor $T_{r4}$. Then the magnitude of the control current $I_2$ may be calculated by the equation, that is $$I_2 = \frac{3.0V}{6\,k\Omega} \simeq 0.5\ mA.$$

The voltage 3.0 V is, as mentioned above, the potential level at the point $T_3$, and the value 6 k is a resistance value of a resistor $R_5$. As a result, the magnitude of a total of the control currents $I_2$ and $I_3$, that is a control current $I_1$, becomes equal to 4.5 mA (4.0 mA+0.5 mA). As a result, the transistor $T_{r5}$ must absorb the control current $I_1$ of 4.5 mA. This control current flows on a control line, that is the line 18 shown in FIGS. 1 and 2, as the chip enable current. However, it should be noted that the control current of 4.5 mA is also produced from each of the circuits 22-2 through 22-8, simultaneously. Therefore, the magnitude of the control current $I_1$ generated by eight circuits 22-1 through 22-8 reaches to 36 mA (8×4.5 mA).

Since the transistor $T_{r5}$ of the circuit 21 must absorb the very large control current $I_1$, such as 36 mA, the transistor $T_{r5}$ must be constructed as a high power transistor. Also, transistors $T_{r7}$ and $T_{r8}$ of the circuit 21 must be constructed as high power transistors, respectively, in order to supply a very large base current to the transistor $T_{r5}$. Thus, the control circuit 21 must be fabricated by high power transistors, and accordingly, the circuit pattern of the circuit 21 becomes very large in size. As a result, the amount of the parasistic capacitance is caused to be very large due to the presence of the large size circuit pattern, and accordingly, the operating speed of the three-state output circuit is considerably reduced. Further, the long line 18 must be fabricated to be considerably wide in width thereof, so as to allow the flow of the very large control current $I_1$. As a result, the amount of the stray capacitance is caused to be very large due to the presence of the very long and wide line 18. This fact also results in the operating speed of the three-state output circuit being reduced.

Figure 3:
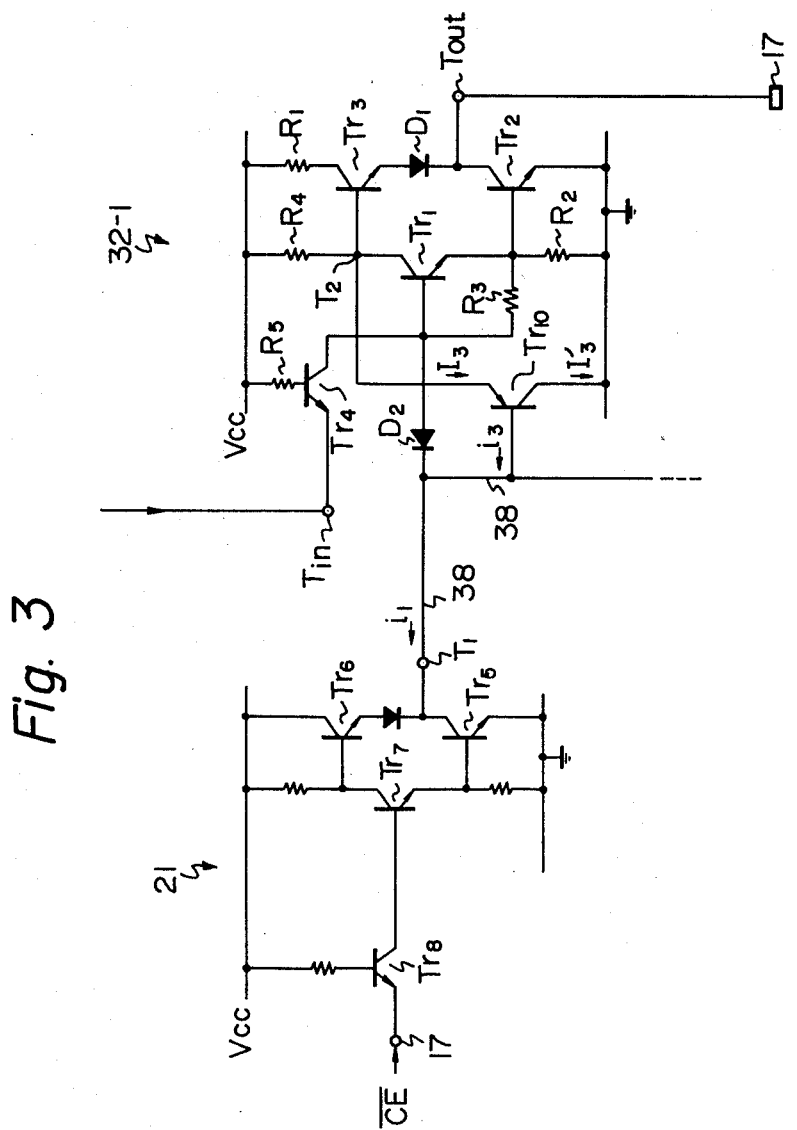
FIG. 3 illustrates a first embodiment of a three-state output circuit, according to the present invention.

In the present invention, the above mentioned large parasistic and stray capacitances are decreased by reducing the magnitude of the control current $I_1$ flowing through the circuit 21 and the line 18. For the purpose of reducing the magnitude of the control current $I_1$, according to the present invention, either or both of the diodes $D_2$ and $D_3$ are substituted with PNP transistors. FIG. 3 illustrates a first embodiment of the three-state output circuit according to the present invention. It should be understood that since the basic construction of the three-state output circuit is constituted of the control circuit 21 and at least one of the circuits 22-1 through 22-8 shown in FIG. 2, only one improved circuit 32-1 (corresponding to the circuit 22-1 of FIG. 2) is illustrated in FIG. 3. In the first embodiment of FIG. 3, the members which are represented by the same reference numerals or symbols of FIG. 2, are identical to each other. Therefore, as can be seen from FIG. 3, only a PNP transistor $T_{r10}$ is newly introduced in the three-state output circuit instead of the prior diode $D_3$ (shown in FIG. 2). The emitter of the transistor $T_{r10}$ is connected to the node $T_2$, as is the anode of the diode $D_3$ shown in FIG. 2. The collector thereof is connected to the ground potential. The base thereof is connected to the terminal $T_1$ of the circuit 21, as is the cathode of the diode $D_3$. In this case, a line 38 corresponds the line 18 shown in FIGS. 1 and 2. Due to the presence of the transistor $T_{r10}$, the control current $I_3$ is separated into a control current $I_3'$ and a control current $i_3$. The magnitude of the control current $i_3$ is represented by $$\frac{I_3}{\beta},$$

where the symbol $\beta$ denotes a current gain factor of the transistor $T_{r10}$ and the value of $\beta$ generally exists within the values from 20 to 100. In a case where the $\beta$ is equal to 100, the magnitude of the current $i_3$ becomes equal to $$\frac{I_3}{100},$$

and accordingly the control current $I_1$ (see FIG. 2) is considerably minimized to a control current $i_1$. In this case, a major part of the current $I_3$ is directly led to and absorbed in the ground as the current $I_3'$, the magnitude of which is equal to the magnitude of $$\left(I_3 - \frac{I_3}{100}\right).$$

Further, a function which is identical to the function of the diode $D_3$ for choking the flow of the aforesaid reverse current from the circuit 21 is still maintained, although the diode $D_3$ is substituted with the transistor $T_{r10}$. This is because no current flows from the base of the PNP transistor $T_{r10}$ to the emitter thereof.

Figure 4:
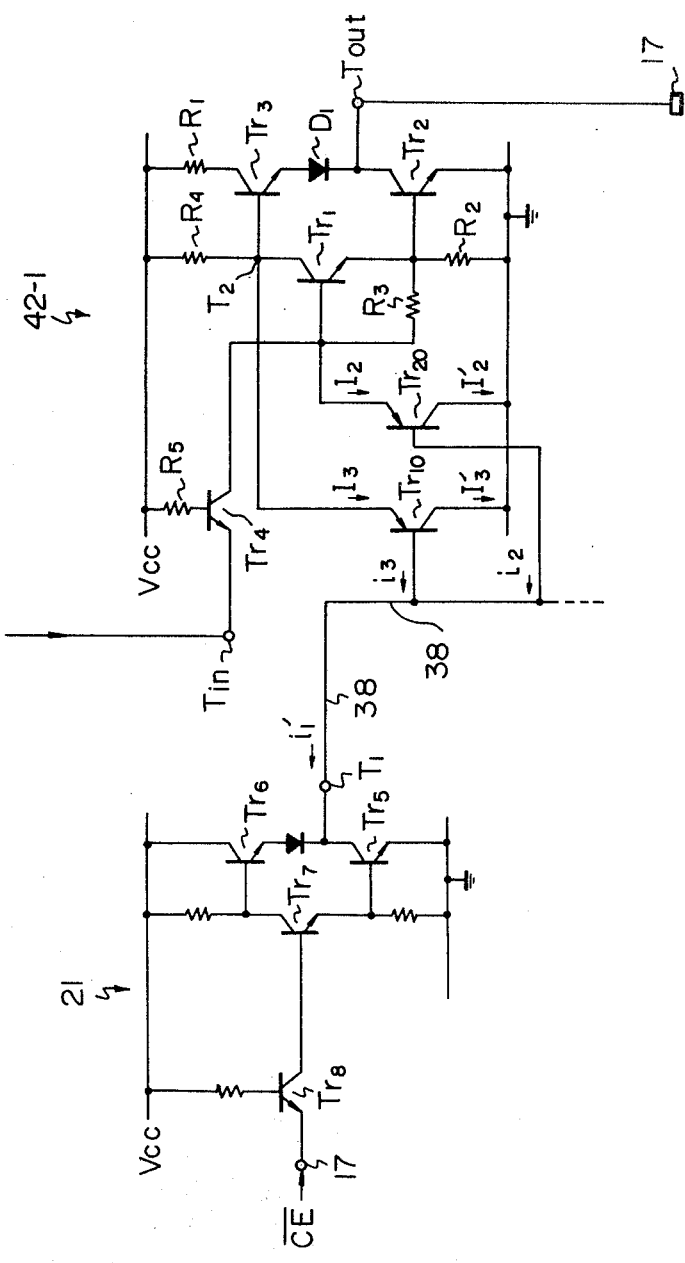
FIG. 4 illustrates a second embodiment of a three-state output circuit, according to the present invention.

In FIG. 4, which illustrates a second embodiment of the three-state output circuit according to the present invention, both the diodes $D_2$ and $D_3$ are replaced by a PNP transistor $T_{r20}$ and the PNP transistor $T_{r10}$, respectively. In this embodiment, the major part of the current $I_2$ from a circuit 42-1 is directly led to and absorbed in the ground as the current $I_2'$, the magnitude of which is equal to the magnitude of $$\left(I_2 - \frac{I_2}{\beta}\right),$$

where the symbol denotes the current gain factor of the transistor $T_{r20}$. If the value of $\beta$ is equal to 100, the control current $I_2$ of the prior art is minimized to a control current $i_2$ the magnitude of which is equal to one hundredth of the magnitude of the current $I_2$. In this case, the magnitude of a control current $i_1'$ is lower than that of the control current $i_1$ developed in the first embodiment. Accordingly, this second embodiment is the most preferable embodiment of the present invention. As similar to the above mentioned function of the diode $D_3$, a function which is identical to the function of the diode $D_2$ for choking the flow of the inverse current from the circuit 21, this function is still maintained by the transistor $T_{r20}$, although the diode $D_2$ is replaced by the transistor $T_{r20}$. The reason has already been mentioned with regard to the transistor $T_{r10}$.

Thus, the very small control current $i_1$ or $i_1'$ flows through the line 38 and the transistor $T_{r5}$ of the control circuit 21. Therefore, the control circuit 21 can be fabricated by low power transistors. Since the low power transistors generally have very small size circuit patterns, the amount of the aforesaid parasistic capacitance can considerably be reduced. Further, since the very small control current flows through the line 38, the width of the line 38 can be considerably narrowed, and, accordingly, the amount of the stray capacitance created along the line 38 becomes very small. Consequently, the operating speed of the three-state output circuit can be increased compared to the prior three-state output circuit including the diodes $D_2$ and $D_3$ shown in FIG. 2.

Figure 5:
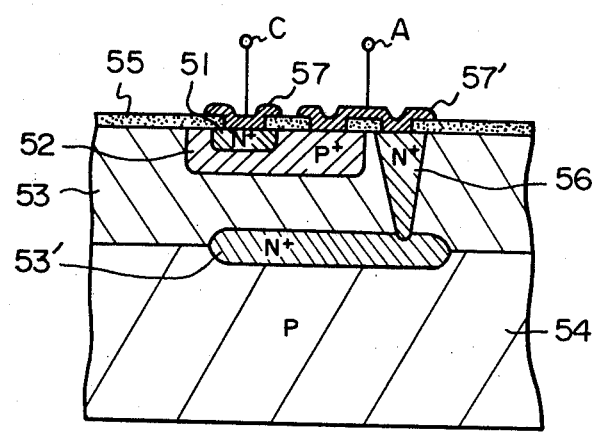
FIG. 5 illustrates a cross-sectional view of each diode shown in FIG. 2.

The three-state output circuit has the further following advantages. These advantages will be clarified with reference to FIGS. 5, 6A, 6B and 7. In FIG. 5, which illustrates a cross-sectional view of diode $D_2$ (and also diode $D_3$), a terminal C indicates the cathode of the diode, a terminal A indicates the anode thereof. The cathode terminal C is connected to an $N^{30}$-type region 51, that is an emitter area of an NPN transistor. This NPN transistor is constituted by a $P^+$-type region 52, that is the base area thereof, and an N-type region 53 and $N^+$-type buried region 53', both regions 53 and 53' being a collector area thereof. Both regions 53 and 53' are formed on a P-type substrate 54. The reference numeral 55 indicates an insulation layer made of silicon dioxide (SiO$_2$).

Figure 6A:
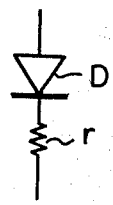
FIG. 6A depicts an equivalent circuit construction of a diode.
Figure 6B:
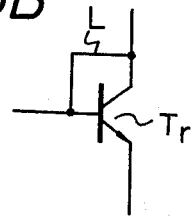
FIG. 6B depicts an equivalent circuit construction of an improved diode utilized in the circuit shown in FIG. 2.

Generally, an equivalent circuit construction of an actual diode is schematically represented by a circuit shown in FIG. 6A. As seen from FIG. 6A, a parasitic resistance r appears at a cathode of a diode D. Therefore, an undesirable voltage drop is developed across the parasitic resistance r. In order to eliminate the undesirable voltage drop, the diode $D_2$ (and also $D_3$) is constituted of a modified NPN transistor. The equivalent circuit construction of the modified NPN transistor is schematically shown in FIG. 6B. As seen from FIG. 6B, the diode $D_2$ (and also diode $D_3$) is constituted of a modified NPN transistor $T_r$. The base and collector thereof are electrically shorted by a conductive lead L.

It should be understood that the modified NPN transistor $T_r$ of FIG. 6B is realized by the above mentioned semiconductor device shown in FIG. 5. The conductive lead L of FIG. 6B is fabricated, in FIG. 5, as an N-type conductive region 56 which acts to electrically connect the $P^+$-type region 52 (corresponding to the base) with both the regions 53 and 53' (corresponding to the collector) via a conductive electrode 57' acting as the anode terminal A.

Figure 7:
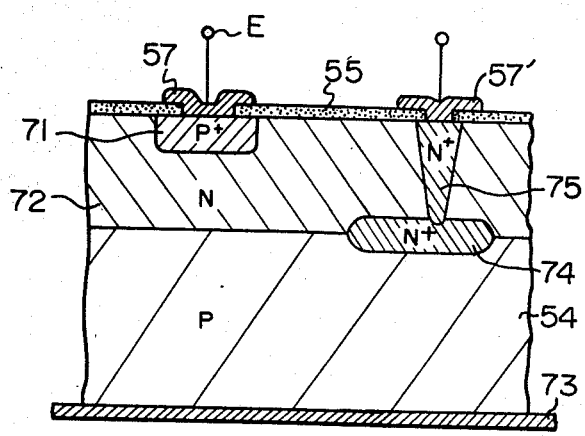
FIG. 7 illustrates a cross-sectional view of a PNP transistor shown in FIG. 3 and each PNP transistor shown in FIG. 4, according to the present invention.

In the present invention, the diode $D_2$ (and also $D_3$) is replaced by the PNP transistor $T_{r20}$ (and also the PNP transistor $T_{r10}$). The PNP transistor $T_{r20}$ (and also the PNP transistor $T_{r10}$) can be fabricated by a PNP transistor having a cross-sectional view which is illustrated in FIG. 7. In FIG. 7, members which are represented by the same reference numerals or symbols in FIG. 5 are identical to each other. A $P^+$-type region 71 is the emitter area of the PNP transistor, an N-type epitaxial layer 72 is the base area of the PNP transistor. The collector area of the PNP transistor is the P-type substrate 54 itself. Since the bottom of the substrate 54 is directly connected to a conductive layer (or stage) 73 of the package (not shown) for mounting the IC chip, the conductive layer (or stage) itself may act as a collector terminal of the PNP transistor. An emitter terminal thereof is indicated by the reference symbol E, and connects the emitter area 71 via the conductive electrode 57. The epitaxial layer 72, acting as a base area, is connected to a conductive electrode 57' via a $N^+$-type buried layer 74 and an $N^+$-type region 75. The electrode 57' is connected to the line 38 (refer to FIG. 3). Since the $N^+$-type buried layer 74 does not lead to the portion which is located right under the P+-type region 71, the function of the PNP transistor is not lost.

As seen from FIG. 7, each of the PNP transistors $T_{r10}$ and $R_{r20}$ can be fabricated as the co-called vertical-type transistor. Accordingly, each of these PNP transistors can be very small in size, and accordingly occupies a very small horizontal area on the substrate, when compared to each of the diodes $D_2$, $D_3$ (refer to FIG. 5) so-called lateral-type NPN transistor. Further, in the present invention, although a major part of the control current flows through the collector of the PNP transistor, this fact induces no bad problem in the three-state output circuit. This is because the major part of the control current is led to and absorbed in the substrate acting as the collector of the PNP transistor. It is due, of course, to the fact that the substrate allows a very large current to flow therethrough.

As has already been explained in detail, the three-state output circuit according to the present invention can be operated at a high degree of operating speed, and also the three-state output circuit according to the present invention can be fabricated as a device very small in size.

What is claimed is:

1. A system including at least one three-state output circuit, each said output circuit comprising
    a first stage for receiving a logic input signal for selective output from said three-state output circuit,
    a control stage for enabling said selective output from said three-state output circuit, and
    an output stage for outputting said selective output, and
    each said output stage comprising
        a phase-splitter transistor which is controlled by the input logic signal, and
        a pull-up transistor and a pull-down transistor connected serially between a power supply line and a ground line of said three-state output circuit, the pull-up and pull-down transistors being made conductive or non-conductive alternately by the phase-splitter transistor to selectively produce a high and a low level signal corresponding to said input signal at a node between the pull-up and pull-down transistors, said signal at said node corresponding to said output signal,
    each said control stage comprising a control circuit which operates responsive to an enable signal to make said transistors of said output stage selectively active and non-active, in which non-active condition a high output impedance is provided at said node and in which active condition said output signal corresponds to said input signal;
    said output stage comprising a first PNP transistor connected at its emitter to both the base of the pull-up transistor and the collector of the phase-splitter transistor, the base of said PNP transistor being connected to the control circuit and the collector thereof being connected to the ground line, and
    said control circuit comprising enable means for selectively absorbing the base current from said first PNP transistor of said output stage, so as to correspondingly create said high impedance output at said node.

2. The system of claim 1, each said output stage comprising a second PNP transistor with its emitter connected to the base of the phase-splitter transistor, its collector connected to the ground point, and its base connected to the control circuit in common with the base of the first PNP transistor, and
    said enable means comprising means for simultaneously and selectively absorbing the base current from both the first and second PNP transistors.

3. The system of claim 1 or 2, each said PNP transistor comprising an integrated semiconductor device formed with a P-type substrate, each collector thereof comprising at least a respective portion of the P-type substrate, each base comprising a respective portion of an N-type layer formed on the P-type substrate, and each emitter comprising a P+-type region formed in the N-type layer, each said PNP transistor comprising a vertical-type PNP transistor.

4. The system of claim 3, said output circuit being formed as an integrated circuit on a single chip, said system comprising
    a plurality of said output stages, each said output stage comprising an output buffer, each said output buffer comprising respective ones of said first and second PNP transistors,
    an integrated circuit (IC) memory device for providing a respective input logic signal to each of said output stages on said chip, and
    said enable means of the control circuit comprising a chip enable circuit for enabling each said output buffer to output the respective output logic signal corresponding to the input logic signals from the IC memory device.

5. The system of claim 4, wherein said PNP transistors in the output buffers are connected in parallel, at their respective bases, to the chip enable circuit.

6. The system of claim 5, comprising a plurality of said single integrated circuit chips,
    each said single chip comprising
        one of said memory devices, and
        a plurality of said output stages, and said system comprising
            a common bus line of plural bits, each said bit of said common bus line being commonly connected to a respective output stage of each said single chip for providing a parallel output from the respective output stages, and
            means for simultaneously activating all of said output stages on a selected one of said chips at a time.

7. The system of claim 6, said input and output logic signals on the output buffers of each chip corresponding to parallel bit outputs of a selected word of the IC memory device on the chip.

8. The system of claim 6, each said IC memory device comprising a read only memory.

* * * * *

UNITED STATES PATENT AND TRADEMARK OFFICE
CERTIFICATE OF CORRECTION

PATENT NO. : 4,322,640

DATED : March 30, 1982

INVENTOR(S) : Fukishima et al

It is certified that error appears in the above-identified patent and that said Letters Patent is hereby corrected as shown below:

Column 2, line 20, delete "a".

Column 8, line 14, "$N^{30}$" should be --$N^{+}$--.

Signed and Sealed this

Fourth Day of October 1983

[SEAL]

Attest:

Attesting Officer

GERALD J. MOSSINGHOFF

Commissioner of Patents and Trademarks